US006501773B1

(12) United States Patent
Volz et al.

(10) Patent No.: US 6,501,773 B1
(45) Date of Patent: Dec. 31, 2002

(54) STABILIZATION OF A LASER ARRAY MODULE

(75) Inventors: Leroy Volz, San Jose, CA (US); Roger A. Hajjar, San Jose, CA (US)

(73) Assignee: Versatile Optical Networks, Inc., San Jose, CA (US)

( * ) Notice: Subject to any disclaimer, the term of this patent is extended or adjusted under 35 U.S.C. 154(b) by 0 days.

(21) Appl. No.: 09/684,349

(22) Filed: Oct. 6, 2000

Related U.S. Application Data (60) Provisional application No. 60/212,507, filed on Jun. 19, 2000.

(51) Int. Cl.[7] .............................. H01S 3/13; H01S 3/00
(52) U.S. Cl. ............................. 372/29.02; 372/29.01; 372/29.011; 372/29.021; 372/33; 372/38.02
(58) Field of Search ........................ 372/29.01, 29.011, 372/29.02, 29.021, 33, 38.02

(56) References Cited

U.S. PATENT DOCUMENTS

| | | | |
|---|---|---|---|
| 4,583,228 A | | 4/1986 | Brown et al. |
| 4,847,479 A | | 7/1989 | Clark et al. |
| 4,998,256 A | | 3/1991 | Oshima et al. |
| 5,745,275 A | * | 4/1998 | Giles et al. .................. 359/124 |
| 5,798,859 A | | 8/1998 | Colbourne et al. |
| 5,943,352 A | * | 8/1999 | Fee ............................... 372/32 |
| 5,956,356 A | * | 9/1999 | Bergmann et al. ............. 372/20 |
| 5,999,546 A | * | 12/1999 | Espindola et al. ........... 372/102 |
| 6,389,046 B1 | * | 5/2002 | Stayt et al. ............. 372/29.011 |

FOREIGN PATENT DOCUMENTS

| | | |
|---|---|---|
| WO | WO 99/08350 | 2/1999 |

\* cited by examiner

*Primary Examiner*—Paul Ip
*Assistant Examiner*—Cornelius H Jackson
(74) *Attorney, Agent, or Firm*—Fish & Richardson P.C.

(57) ABSTRACT

A laser array system is described. The system includes a plurality of lasers, a switching mechanism, a wavelength locking mechanism, and a laser parameter feedback control. Each laser provides a collimated beam having certain wavelength and power. The beam has at least two parts, first part of the two parts used for stabilization of the wavelength and power. The switching mechanism is configured to receive and sequentially select the first part of the collimated beam from the plurality of lasers. The wavelength locking mechanism is configured to monitor and measure a drift of the wavelength and power of a selected laser. The laser parameter feedback control is configured to adjust laser parameters of the selected laser.

25 Claims, 11 Drawing Sheets

STABILIZATION OF A LASER ARRAY MODULE

CROSS REFERENCE TO RELATED APPLICATION

This application claims the benefit of the priority of U.S. Provisional Application No. 60/212,507, filed on Jun. 19, 2000, and entitled Stabilization of Optical Power Levels and Wavelengths of Multiple Lasers.

BACKGROUND

The present disclosure generally relates to systems and methods for producing laser beams at stabilized frequencies and powers.

An optical WDM system uses a single fiber link to simultaneously transmit optical carriers of different wavelengths so that different channels of data can be carried by the different carriers and sent over the optical fiber link at the same time. The optical signal in such a fiber link is a WDM signal because it is a combination of different optical carriers at different wavelengths. Hence, a WDM system can provide a broadband transmission and a high transmission speed. Dense WDM (DWDM) techniques have been used to increase the number of multiplexed wavelengths in a WDM fiber link by reducing the wavelength spacing between two adjacent wavelengths. In addition, a WDM system can be made scalable to allow expansion of the transmission capacity by simply adding the number of optical carriers in the existing fiber links without adding new fiber links.

To increase the bandwidth and the number of communication channels in WDM networks, the International Telecommunications Union (ITU) has proposed the DWDM system in which the separation between communication channels is only 0.8 nm, or 100 GHz in frequency. Thus, a light source for such a network must also have a very narrow output linewidth. This requirement entails having the wavelength of the output signal to be concentrated in a very narrow portion of the optical spectrum. Further, the wavelength of the source must be stable to avoid drifting into the wavelength range of another channel.

Conventional wavelength lockers monitor and control the wavelength of light produced by a light source such as a laser. A laser is typically tuned to produce light of a predetermined wavelength. However, a number of internal and external factors may cause the laser wavelength to change or drift. For example, in a diode case, the driving current can change the resonant characteristics of the cavity. Consequently, the wavelength of the light produced by a laser drifts from the predetermined wavelength. Other factors, such as shot noise, temperature fluctuation, and mechanical vibrations, may also change the laser wavelength.

Wavelength locking mechanisms have been used to stabilize a laser at a desired wavelength. In some wavelength locking mechanisms, for example, light from the laser is transmitted to a collimator, and travels down a fiber. Conventional systems monitor the wavelength of the incoming light by transmitting the beam to a spectrum analyzer. The spectrum analyzer determines the wavelengths that comprise the beam of light. The spectrum analyzer transfers the information on the wavelength to a feedback system. The feedback system uses this information to change the temperature or other laser parameters to compensate for any drift in the wavelength of the light from the predetermined value. The temperature is often controlled using a thermoelectric (TE) pad or cooler.

SUMMARY

In recognition of the above-described difficulties, the inventors recognized the need for providing a laser system in which the wavelength and power of the transmitted light is monitored and controlled without significant interruption of the light. Further, a need exists for a system that is cheaper and easier to manufacture.

The present disclosure describes a laser array system. The system includes a plurality of lasers, a switching mechanism, a wavelength locking mechanism, and a laser parameter feedback control.

Each laser provides a collimated beam having certain wavelength and power. The beam has at least two parts, first part of the two parts used for stabilization of the wavelength and power. The switching mechanism is configured to receive and sequentially select the first part of the collimated beam from the plurality of lasers. The wavelength locking mechanism is configured to monitor and measure a drift of the wavelength and power of a selected laser. The laser parameter feedback control is configured to adjust laser parameters of the selected laser.

BRIEF DESCRIPTION OF THE DRAWINGS

Different aspects of the disclosure will be described in reference to the accompanying drawings wherein:

FIGS. 4 to 6B shows four different configurations of an optical switch;

DETAILED DESCRIPTION

The present disclosure describes a laser array module in which the wavelength and power of the transmitted light may be monitored and controlled. This laser array module provides wavelength and power stabilization without significant interruption of the light beam emanating from the array module. Furthermore, configurations of the laser array module using an optical switch allow stabilization of a series of lasers. This configuration provides significant advantage over other configurations in which a series of temperature-stabilized wavelength locking mechanisms are used to respectively stabilize the lasers. The wavelength locking mechanisms may be costly. Moreover, the calibration of the mechanisms may be time consuming.

Figure 1A:
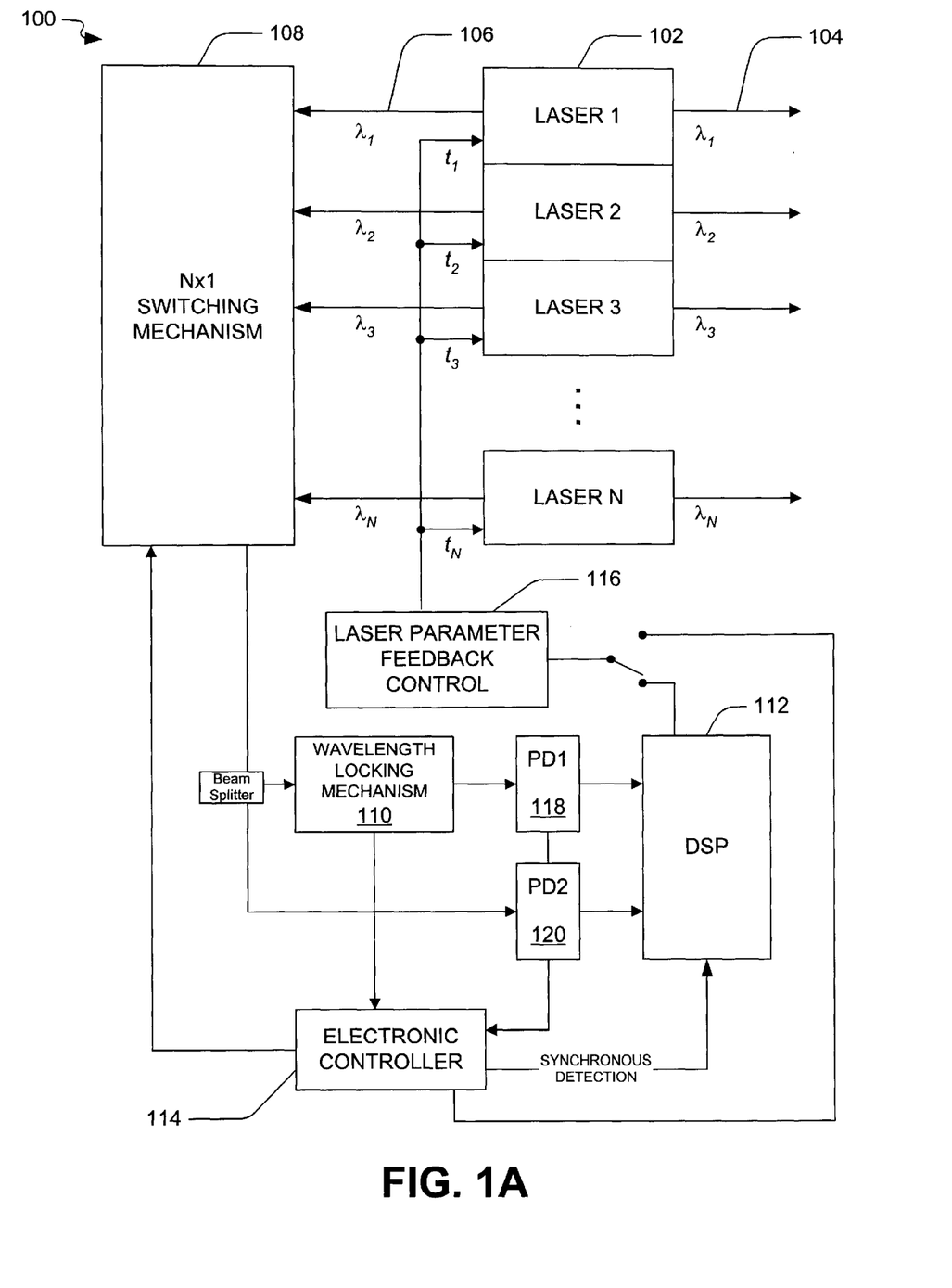
FIG. 1A illustrates an embodiment of a laser array module that provides laser wavelength and power control.

FIG. 1A illustrates an embodiment of a diode laser array module 100 that provides laser wavelength and power control. The laser array module 100 includes a plurality of lasers 102 configured to provide light beams 104, 106 of different wavelengths, $\lambda_1$ to $\lambda_N$. The array module 100 may also include an N×1 switching mechanism 108, a wavelength locking mechanism 110, a controller 114, and a laser parameter feedback control 116. The switching mechanism 108 may be an optical switch or fiber coupler. In some configurations, a pair of photodiodes 118, 120 and a digital signal processor (DSP) 112 may be used to convert optical signals to electrical signals for DSP processing. The controller 114 may be used, in this configuration, for timing synchronization.

A plurality of lasers 102 is configured to provide output light. Each laser may be individually controlled to lase at a wavelength different from other lasers. For example, the wavelength of the lasers 102 may operate at different ITU wavelengths.

The switching mechanism 108 may be used to multiplex the light beams of different wavelengths from the lasers 102 for stabilization processing by a common wavelength locking mechanism 110. The common wavelength locking mechanism 110 is designed to lock different lasers at different laser wavelengths. In one implementation, the mechanism 110 can lock one laser at a time. Hence, the N×1 switch 108 switches one output beam at a time from a laser in the module 102 into locking mechanism 110 and the control loop in a predetermined sequence.

The laser wavelength control loop includes the locking mechanism 110, the PD1 118 and PD2 120, the DSP 112, and the laser parameter feedback control 116. The DSP is designed with some processing intelligence and logic to determine the errors in wavelength and power levels of a laser based on output signals from the photodetectors 1 and 2 118, 120. A command is then generated and sent to the laser parameter feedback control 116. The control 116 then responds to adjust the respective laser to reduce the detected errors.

Figure 1B:
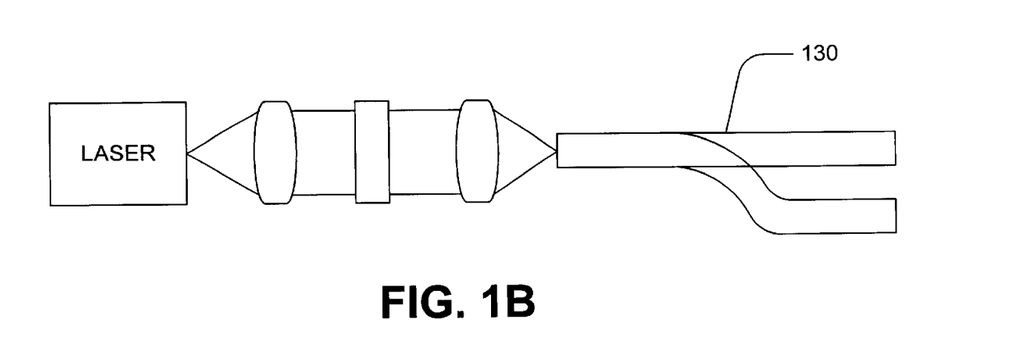
FIGS. 1B to 1D show different ways in which a laser beam may be divided for primary purpose and for feedback.
Figure 1C:
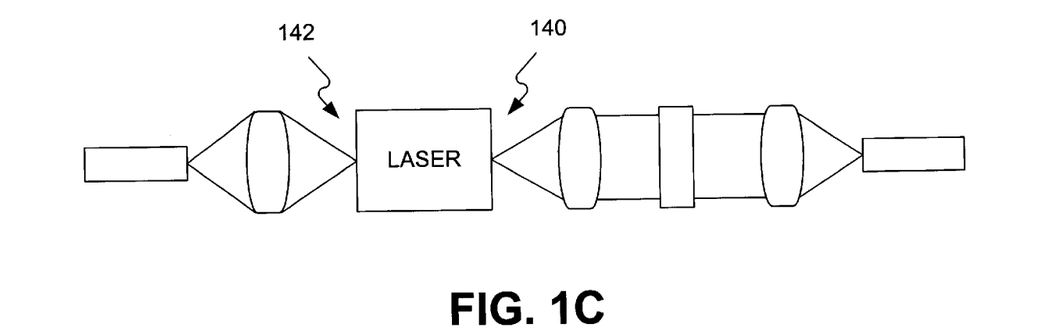

Since the stabilization processing may be configured in a feedback loop, the lasers 102 may be designed to provide a portion of the light for the feedback loop in addition to the primary output of the laser. This may be done by providing an optical beam splitter or fiber tap coupler 130 in the output of each laser as shown in FIG. 1B. This may also be done by tapping a secondary facet 142 for the feedback light as shown in FIG. 1C. For example, a laser may provide about 90 to 95% of the light through a first facet 140 and provide 5 to 10% of the light through a second facet 142. In the illustrated embodiment, the first facet 140 provides light beam through the front of the laser and the second facet 142 provides light beam through the rear.

Figure 1D:
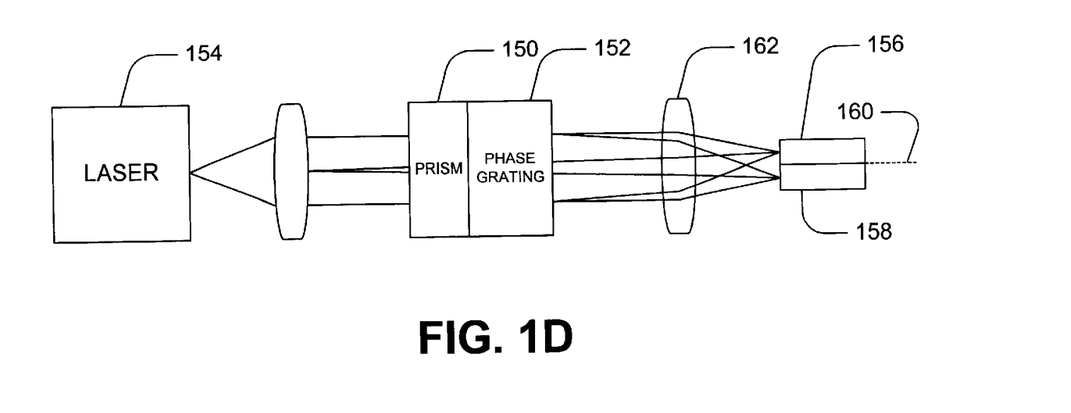

The laser beam may also be tapped using an integrated grating approach as shown in FIG. 1D. The illustrated configuration shows a thin prism 150 with Phase Grating 152 mounted on the prism 150. The prism 150 is configured to divide the output light from the laser 154 into two parts. The two parts of the beam may be directed to two separate output fibers 156, 158. One part of the beam may be configured to contain 90 to 95% of the beam power, while the other part is configured to contain 5 to 10% of the beam power. The two fibers 156, 158 are displaced from the centerline or optical axis 160 of the lens 162. One fiber 156 is slightly above the optical axis 160, and the other fiber 158 is slightly below the axis 160. By using the prism 150, the main beam may be deviated slightly upward to properly focus the top fiber 156. The grating 152 diffracts a selected amount of energy at an angle needed to focus on the bottom fiber 158. This configuration provides a means for sampling an output fiber optic signal to determine parameters such as wavelength, power level, and signal modulation. Alternatively, the top fiber 156 may be placed directly on the optical axis 160. This eliminates the need for a prism to deviate the main beam. The grating 152 may deviate the selected amount of light to the bottom fiber 158.

As stated above, the wavelength of the output light may be adjusted by an external means that controls the laser parameters. In one embodiment, the temperature of the laser, such as a laser diode, may be adjusted to modify or stabilize its wavelength.

Figure 2:
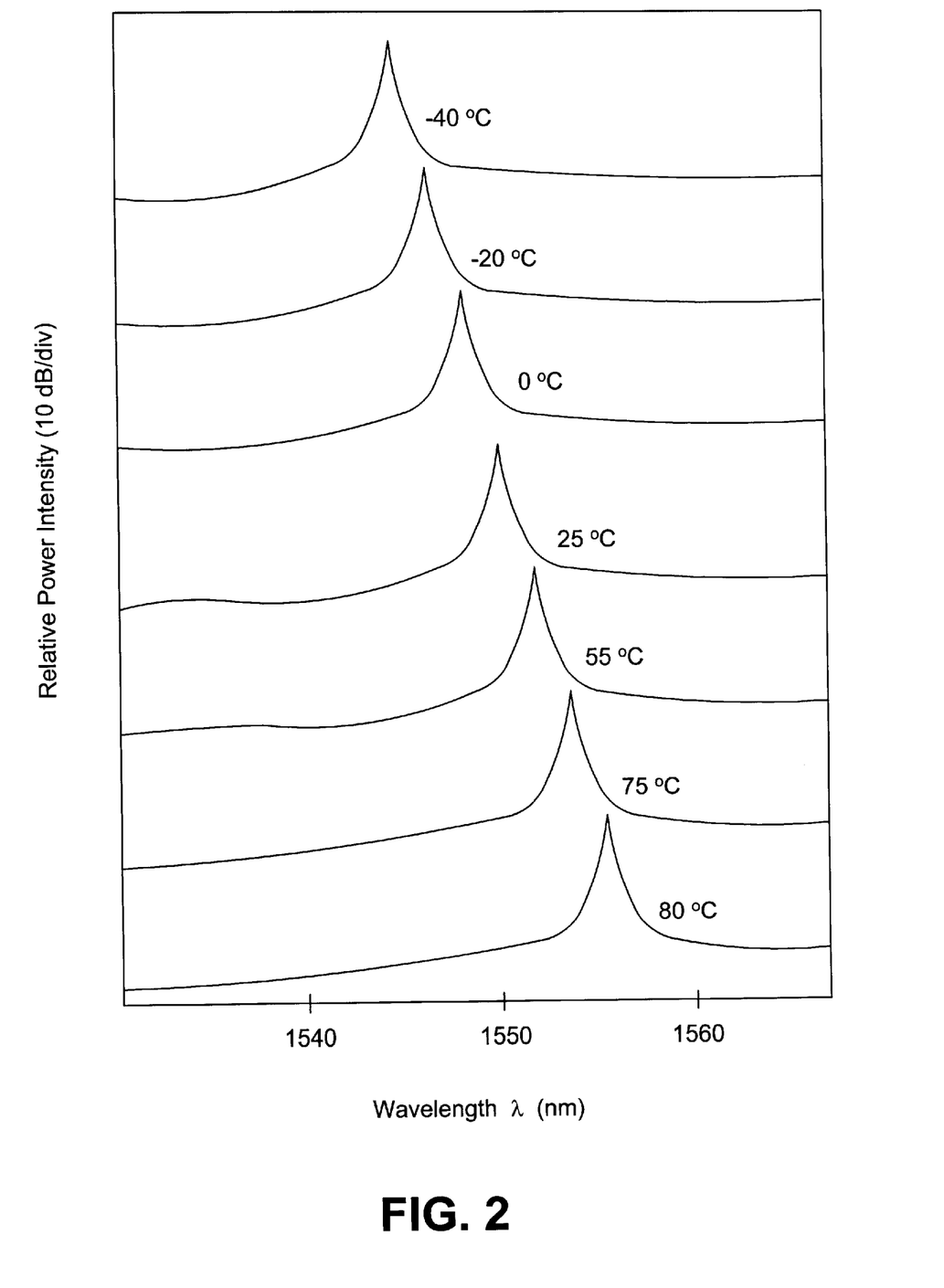
FIG. 2 shows one embodiment of an effect the temperature of a laser may have on the wavelength of the collimated beams.

FIG. 2 shows one example of the effect of the temperature of a diode laser on its output wavelength. As the temperature rises, the laser wavelength increases. This is in part due to the expansion of the laser resonator of the diode. In this embodiment, the laser array module 100 may utilize a thermo-electric (TE) pad or cooler as a laser parameter feedback control for each laser in the laser array 102. Therefore, the control 116 includes at least an array of TE pads/coolers that are respectively in thermal contact with lasers. The feedback control 116 may also use other laser parameters to control the laser wavelength.

Tapped beams 106 from the plurality of lasers 102 may be multiplexed to the stabilization processing portion of the laser array module 100. The stabilization processing portion may include the wavelength locking mechanism 110 and the laser parameter feedback control 116. In the embodiment of FIG. 1A, each tapped laser beam is switched to the wavelength locking mechanism 110 by the N×1 switch 108.

Figure 3A:
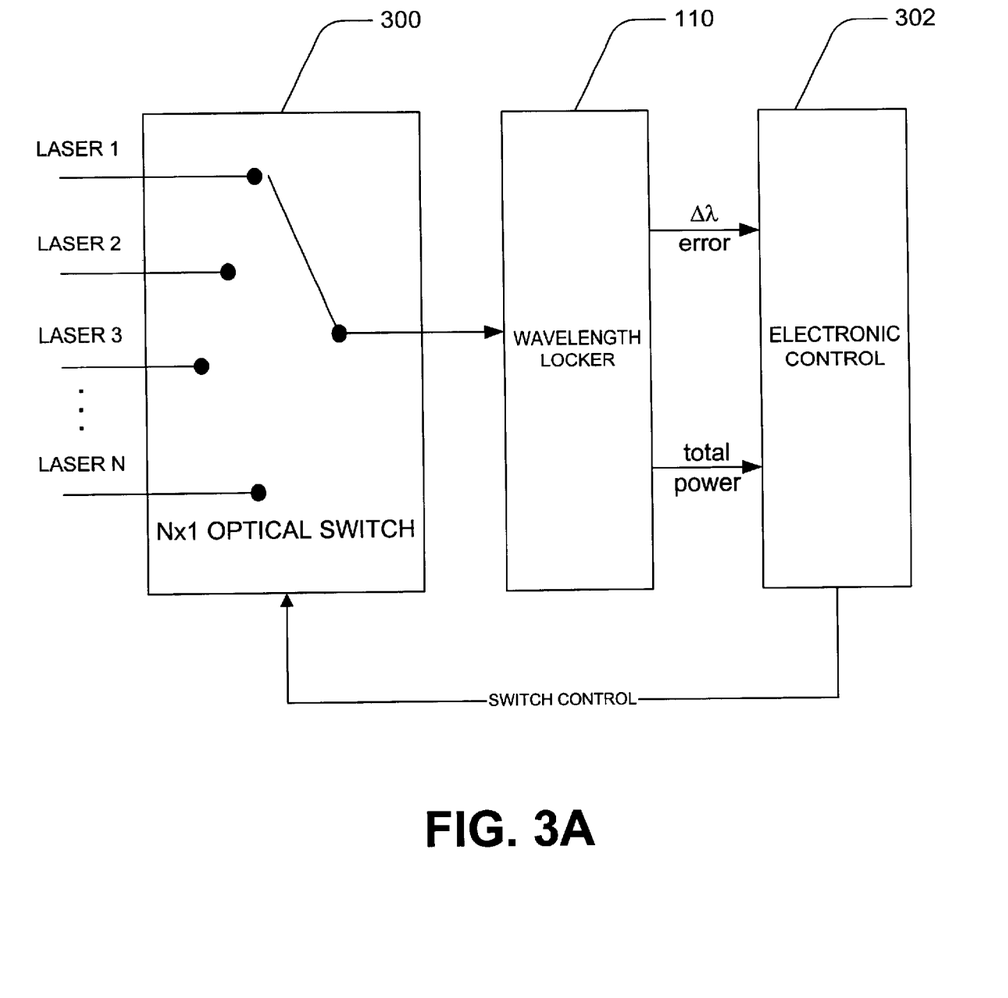
FIGS. 3A and 3B show different embodiments of a switching mechanism shown in the laser array module.

FIG. 3A shows one embodiment 300 of the N×1 switch 108 in FIG. 1A. The switch 300 is an optical switch configured to sequentially pass the tapped beams from the lasers one at a time. In this embodiment, the switch is controlled by an electronic control 302. The electronic control 302 also measures the wavelength drift and the total power. These measured parameters are utilized to generate commands for the laser parameter feedback control 116.

Figure 3B:
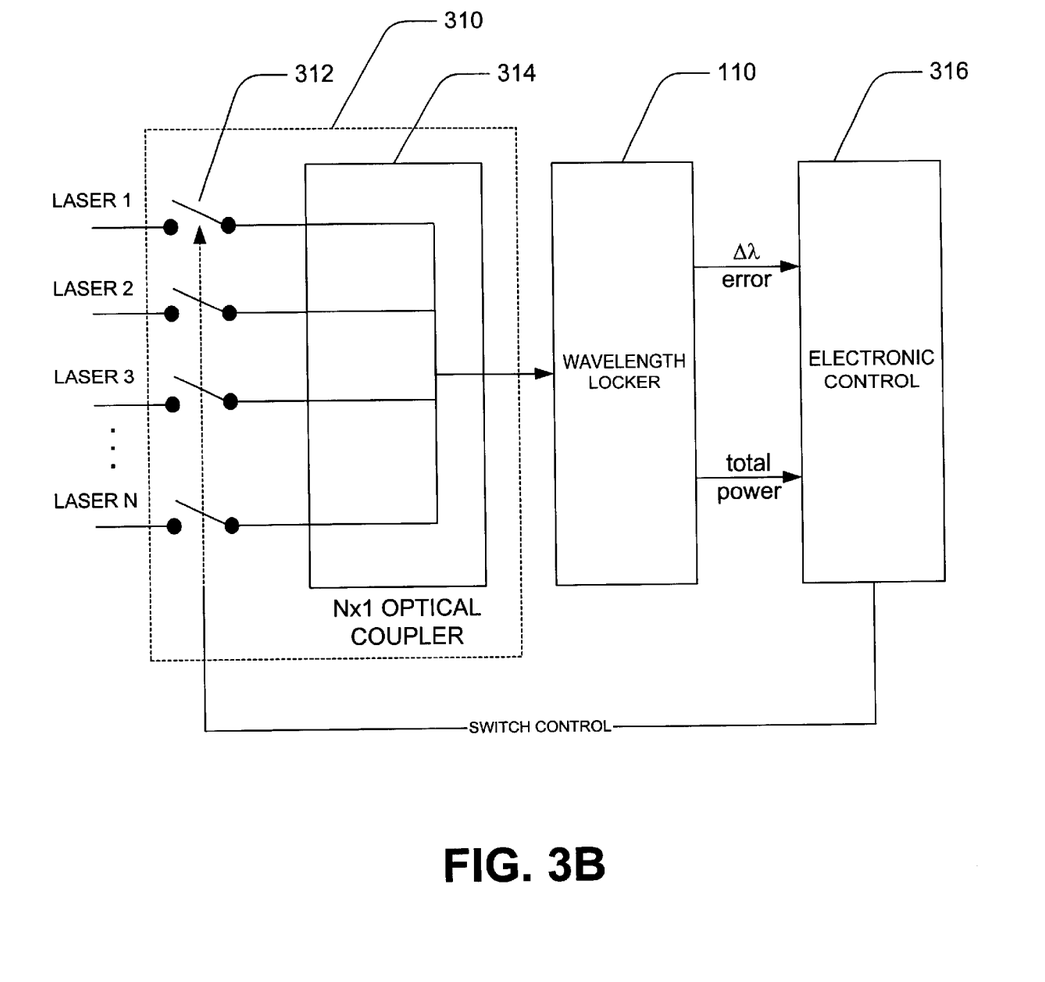

In another embodiment, shown in FIG. 3B, the switch 310 includes N optical switches 312 configured to be controlled by an electronic control 316. The control 316 may sequentially turn each switch 312 on and off to pass the beams from the lasers. In this embodiment, the switch 310 also includes an N×1 optical coupler 314 to couple the switched light from the optical switches 312 to the wavelength locker 110.

Figure 4:
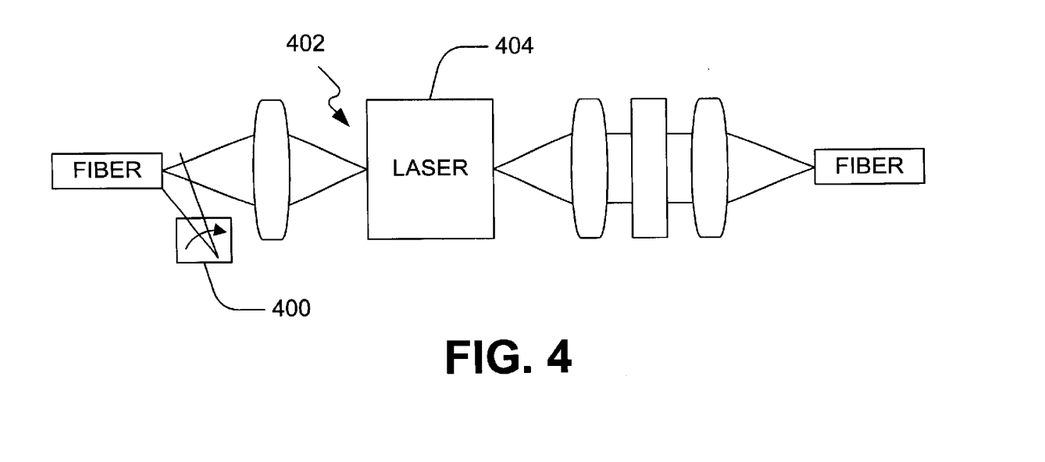

FIGS. 4 through 6B illustrate exemplary configurations of an optical switch. FIG. 4 illustrates an optical switch designed with a moving shutter 400 positioned at the output of a secondary facet 402 of the laser 404. The shutter 400 may be controlled to move between positions where the first position allows the light beam to pass while the second position blocks the light beam from passing.

Figure 5:
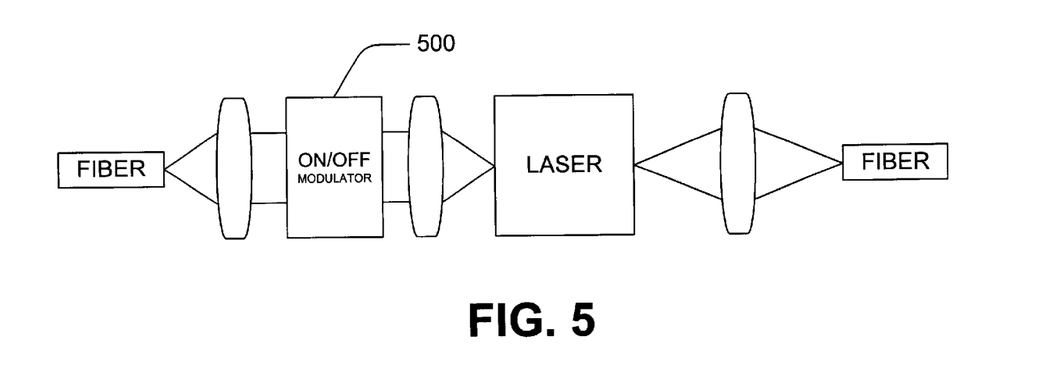

In another embodiment of an optical switch shown in FIG. 5, the moving shutter 400 of FIG. 4 is replaced with an electronic modulator 500 that modulates the light beam at least between an on-state and an off-state. However, the light may be modulated into any number of modulating states.

In order to avoid modulating the laser beams individually, the shutter 400 or the modulator 500 may modulate the output of the switch. For example, in FIG. 6A, a switching lens 604 is used to receive the output light from a plurality of fibers 606 and direct them to a switching galvo 600. The galvo 600 modulates the output light. The switching galvo 600 operates to adjust a mirror 602 to pass the output light of a specific wavelength. In the illustrated embodiment of FIG. 1A, the switching galvo 600 of FIG. 6A may be inserted in place of the switching mechanism 108.

Figure 6A:
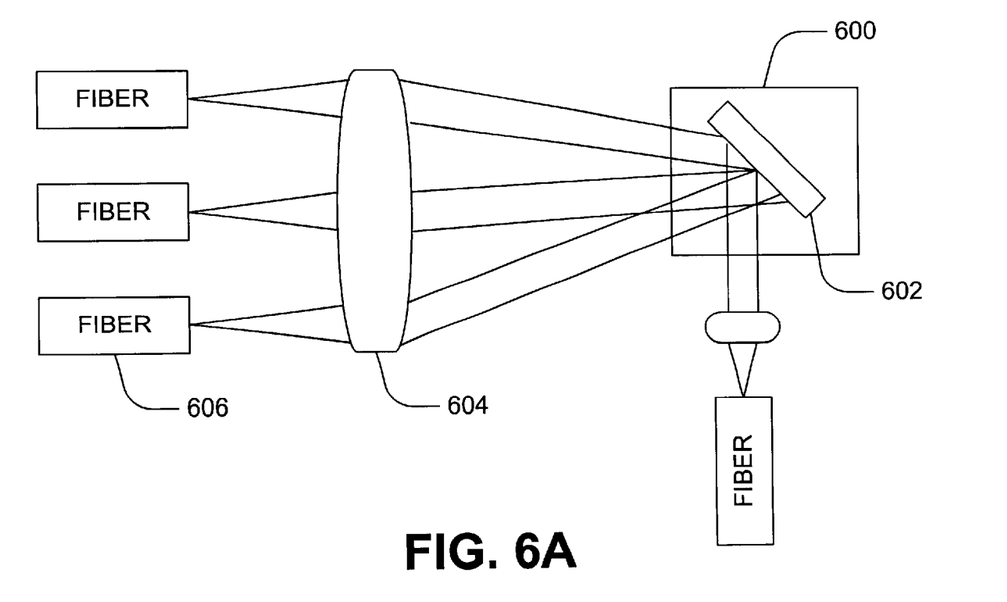
Figure 6B:
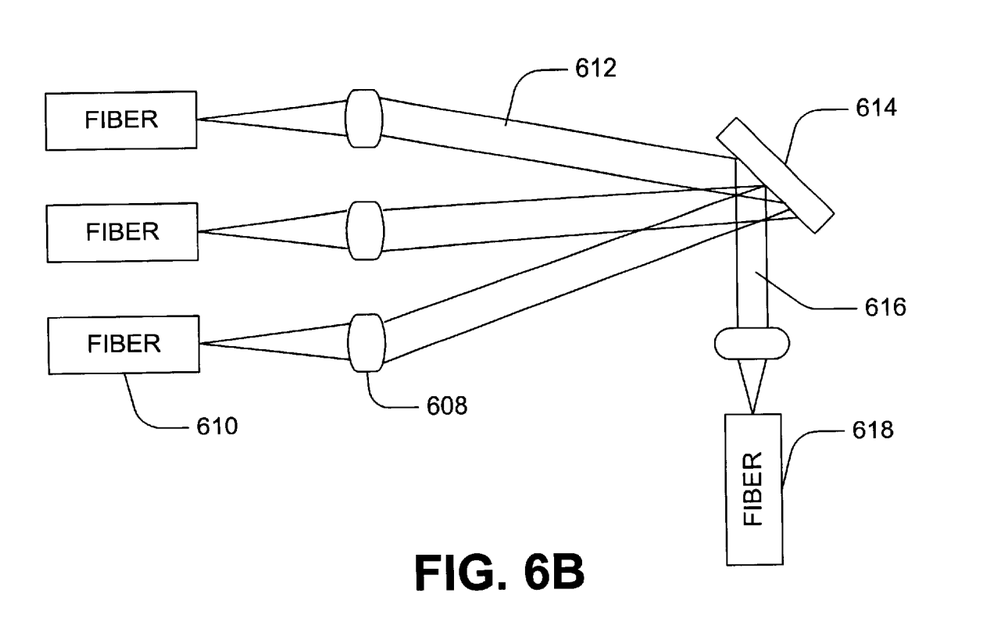

FIG. 6B shows a variation of FIG. 6A, where a plurality of collimating lenses 608 are used to respectively convert the output beams from the multiple fibers 610 to a plurality of collimating beams 612. A galvo mirror 614 may be adjusted to ass one collimating beam having a specific wavelength 616 into an output fiber 618.

In the illustrated embodiment of FIG. 1A, the amplitude dither may modulate the light of individually selected lasers in a sinusoid pattern such that the power of a selected laser may be modulated as well as the frequency. In this configuration, power detectors (PD1 118 and PD2 120) are configured to sample the laser beams that are split from output of one laser to obtain power level signals. Since the power level signal output from the PD1 118 measures the output of the wavelength locking mechanism 110, the power level signal at that point is a filtered signal. The output signal from the PD2 120 provides a reference for the digital signal processor (DSP) 112. In some embodiments, the DSP 112 may be replaced by an analog synchronous detection block. A signal to noise ratio may be improved by doing some form of phase-locked loop (PLL) and bandpass filtering after the PD1 and PD2.

Figure 7A:
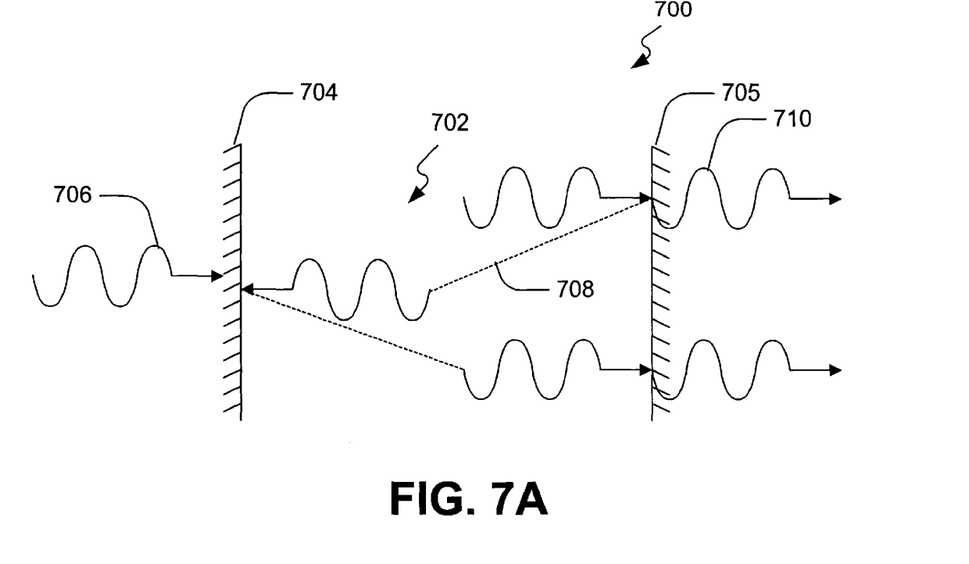
FIG. 7A shows a temperature stabilized Fabry-Perot filter according an embodiment of the present disclosure.

In some embodiments, the wavelength locking mechanism 110 of FIG. 1A may be configured with a temperature stabilized Fabry-Perot filter 700 as shown in FIG. 7A. The Fabry-Perot filter 700, sometimes referred to as an etalon, includes the cavity 702 formed by two highly reflective mirrors 704, 705 placed parallel to each other. The input light beam 706 to the filter 700 may enter the first mirror 704 at right angle to its surface. The output of the filter 700 is the light beam leaving the second mirror 705. As described, the input signal 706 is incident on the left surface 704 of the cavity 702. After one pass through the cavity 702, a part 710 of the light leaves the cavity 702 through the right facet 705 and a part 708 is reflected. A part of the reflected wave 708 is again reflected by the left facet 704 to the right facet 705. For those wavelengths for which the cavity length is an integral multiple of half the wavelength in the cavity 702, all the light waves transmitted through the right facet 705 add in phase. Such wavelengths are called the resonant wavelengths of the cavity. The fraction of incident light that is reflected by the mirror is referred to as the reflectivity (R) of the mirror. For example, the resonant wavelength of the cavity may be adjusted by changing the cavity spacing through the change in temperature of the cavity.

The power transfer function of a filter is the fraction of input light power that is transmitted by the filter 700 as a function of optical wavelength, $\lambda$, when the cavity spacing is fixed at a constant. The power transfer function of the filter 700 is plotted in FIG. 7B. The widths of the waves become narrower as R increases.

In a WDM system, the wavelengths for different WDM channels are evenly spaced. The spacing is usually far apart compared to the width of each passband of the filter transfer function. The spectral range between two successive passbands of the filter is called free spectral range (FSR).

Figure 7B:
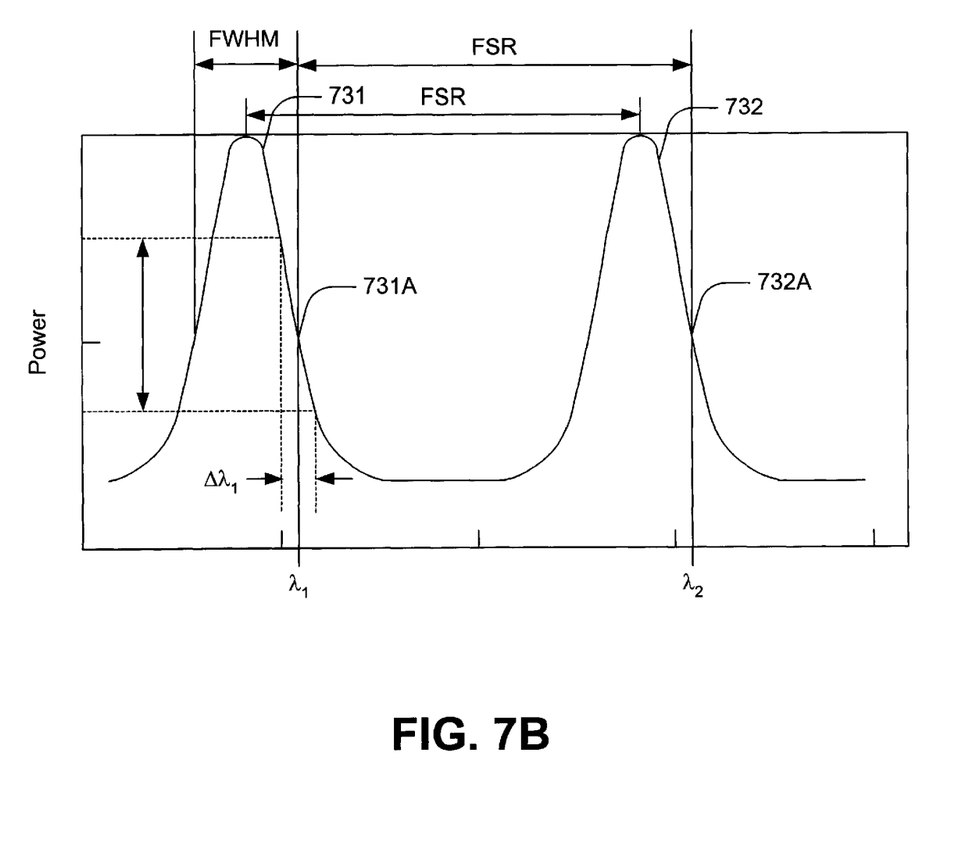
FIG. 7B shows a power transfer function of the Fabry-Perot filter shown in FIG. 7A.

In the illustrated embodiment of FIG. 7B, the cavity spacing is fixed. This allows the filter 700 to lock wavelengths of output beams from a plurality of lasers. The wavelengths from the plurality of lasers are evenly spaced so that the wavelength spacing is substantially equal to the FSR and the WDM channel spacing. For example, FIG. 7B shows two wavelengths, $\lambda_1$ and $\lambda_2$, from two lasers, which are FSR length apart. In this illustration, the wavelength of the first laser is adjusted to lock at $\lambda_1$, which is set on the side of the first transmission peak 731. The wavelength $\lambda_1$ may be adjusted to lock at a point in the curve where the slope of the peak 731 is highest 731A. This allows the dithering of the wavelength $\lambda_1$ about $\Delta\lambda_1$ to be highly exaggerated at the output so that the feedback loop of the filter may easily lock the wavelength at $\lambda_1$.

To lock the wavelength of the second laser at $\lambda_2$ that is FSR apart from $\lambda_1$, the switching mechanism 108 is controlled to switch off the first laser beam and to switch the second laser beam into the locking mechanism 110. This would place the filter to operate at the slope point 732A of adjacent transmission peak 732 for the second wavelength, $\lambda_2$. Locking of other lasers at different wavelengths can be similarly configured. Notably, the above locking mechanism does not require physical tuning of the Fabry-Perot filter 700 by adjusting the filter parameters (e.g. cavity spacing). Therefore, the filter 700 can be stabilized under the same condition in locking different lasers. Alternatively, the filter 700 may be physically tuned by adjusting, for example, the cavity spacing, to change the transmission from one wavelength to another in order to provide frequency references in locking different lasers.

There are at least four types of servo control loops desirable for the wavelength locking mechanism 110 (FIG. 1A). The first controls the power level of each of the sourcing lasers. The second controls the temperature of the lasers. The third controls the operating wavelength of each of the source lasers. The fourth controls the temperature of the Etalon reference. In addition to the servo controls, there are calibration requirements, which must be performed during manufacture as well as during the operation of the device. These servo systems may be implemented using DSP based controls. The systems are optically integrated systems. The below described designs of the optically integrated monitoring servo systems are integrated such that the systems only need to be provided with data, input clock, and power to operate as communication devices. All the control and monitoring is performed within the system.

Figure 8A:
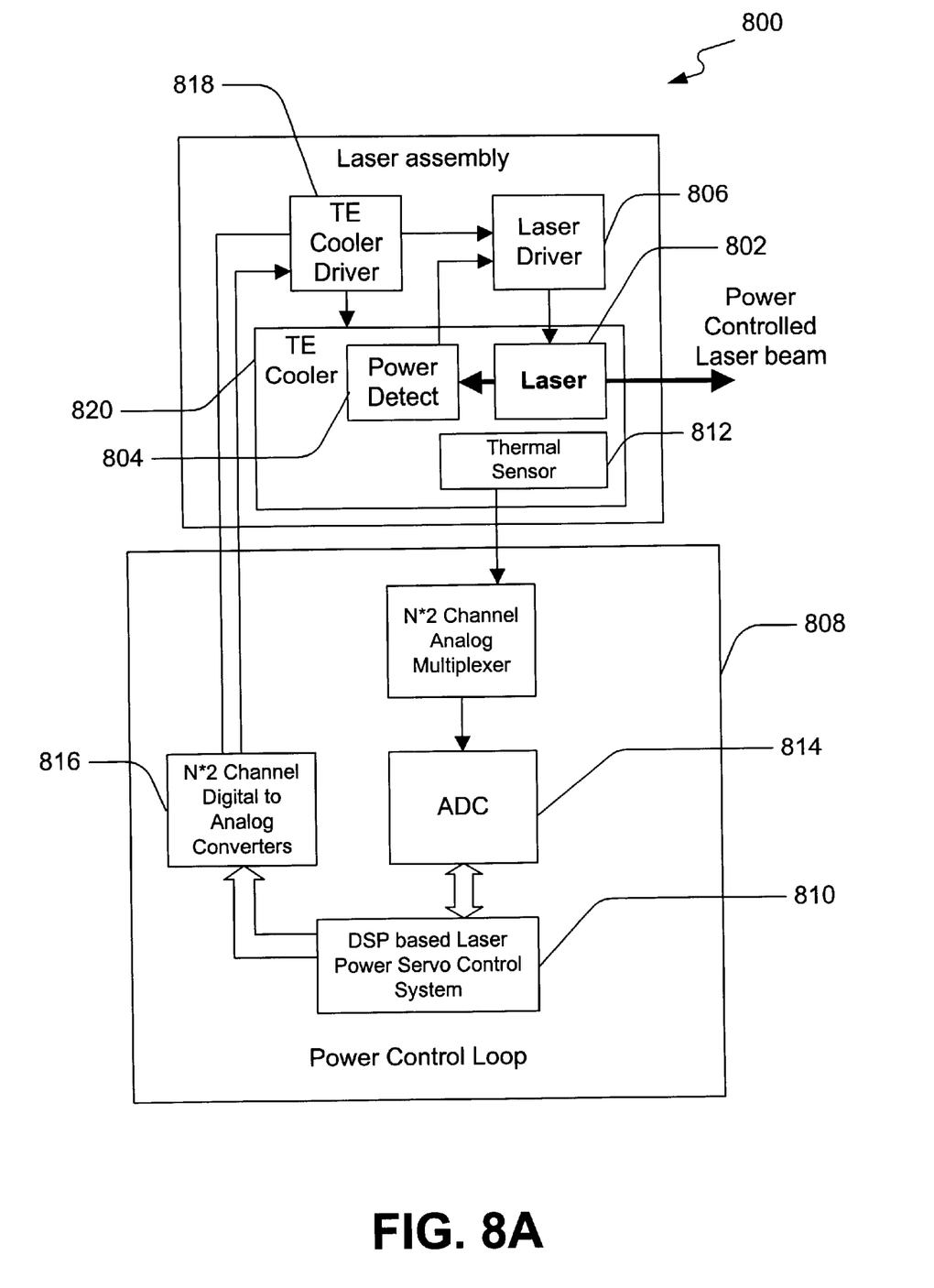
FIG. 8A shows a laser power control servo system that monitors the power being generated by a laser.

The laser power control servo system 800, shown in FIG. 8A, monitors the power being generated by the laser 802. The system 800 utilizes the signal derived from the Power Detector Photo Diode 804, which monitors the laser's secondary (back facet) output continuously. This signal is fed into the dedicated laser driver circuit 806, which contains a closed loop power control circuit 808. The closed loop control circuit 808 maintains the power output of the laser 802 at the reference value demanded by the system DSP 810. The system DSP 810 learns the correct value to demand during factory calibration of the wavelength locking mechanism. The DSP can measure the power of each of the lasers as they are being processed for wavelength control.

The laser temperature may also be controlled by the laser power control servo system 800. The system 800 monitors the temperature utilizing the signal derived from the laser thermal sensor 812, which is located near each laser 802. This temperature level signal is sampled by an analog-to-digital converter 814 on command from the system DSP 810, at some appropriate periodic rate. The rate may be programmed to be adequate to sustain the laser temperature at an acceptable level. The system DSP 810 then performs the temperature control based on the latest temperature reading and the commanded temperature setting. The DSP 810 may demand the desired value to the digital-to-analog converter 816. The generated voltage is sent to the TE cooler driver 818, which drives the TE cooler 820 with the selected amount of power. The temperature of the laser 802 is directly affected by this change in temperature of the TE cooler 820.

Figure 8B:
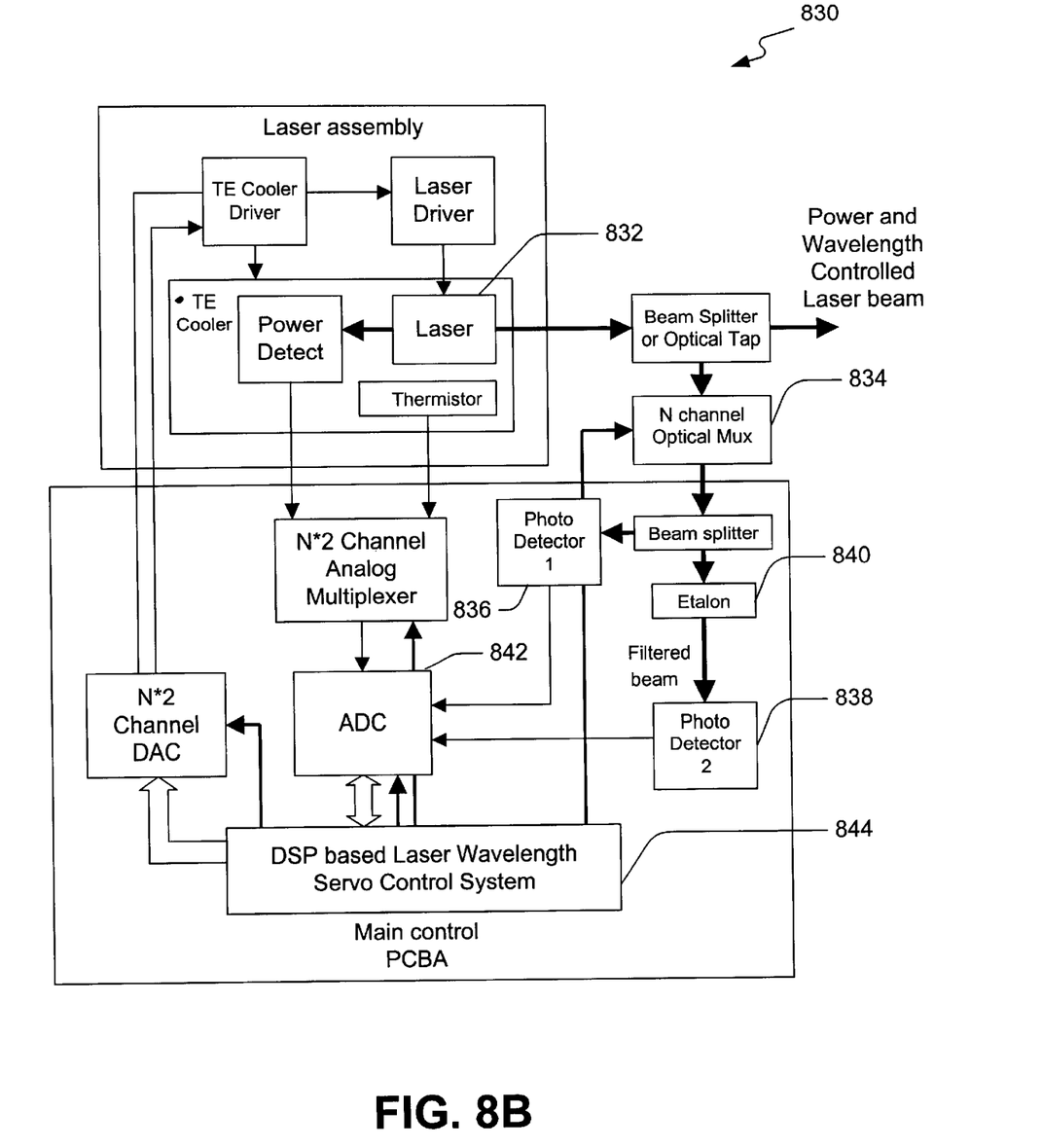
FIG. 8B shows a wavelength control servo system that monitors the wavelength of a laser.

The wavelength control servo system 830 is shown in FIG. 8B. The system 830 monitors the wavelength of the laser 832 selected by the optical multiplexer 834 utilizing the signal derived from the two photo detectors 836, 838 located near the etalon 840. These wavelength dependent signals are sampled by the analog-to-digital converter 842 on command from the system DSP 844, at some appropriate periodic rate. The rate may be programmed to be adequate to sustain the wavelengths at their desired level. The system DSP 844 performs the wavelength control based on the latest sample. The DSP 844 then commands the desired change in temperature to the temperature control portion of the laser power control servo system 800. The laser 832 is affected by this requested change in temperature and the wavelength is corrected.

Figure 8C:
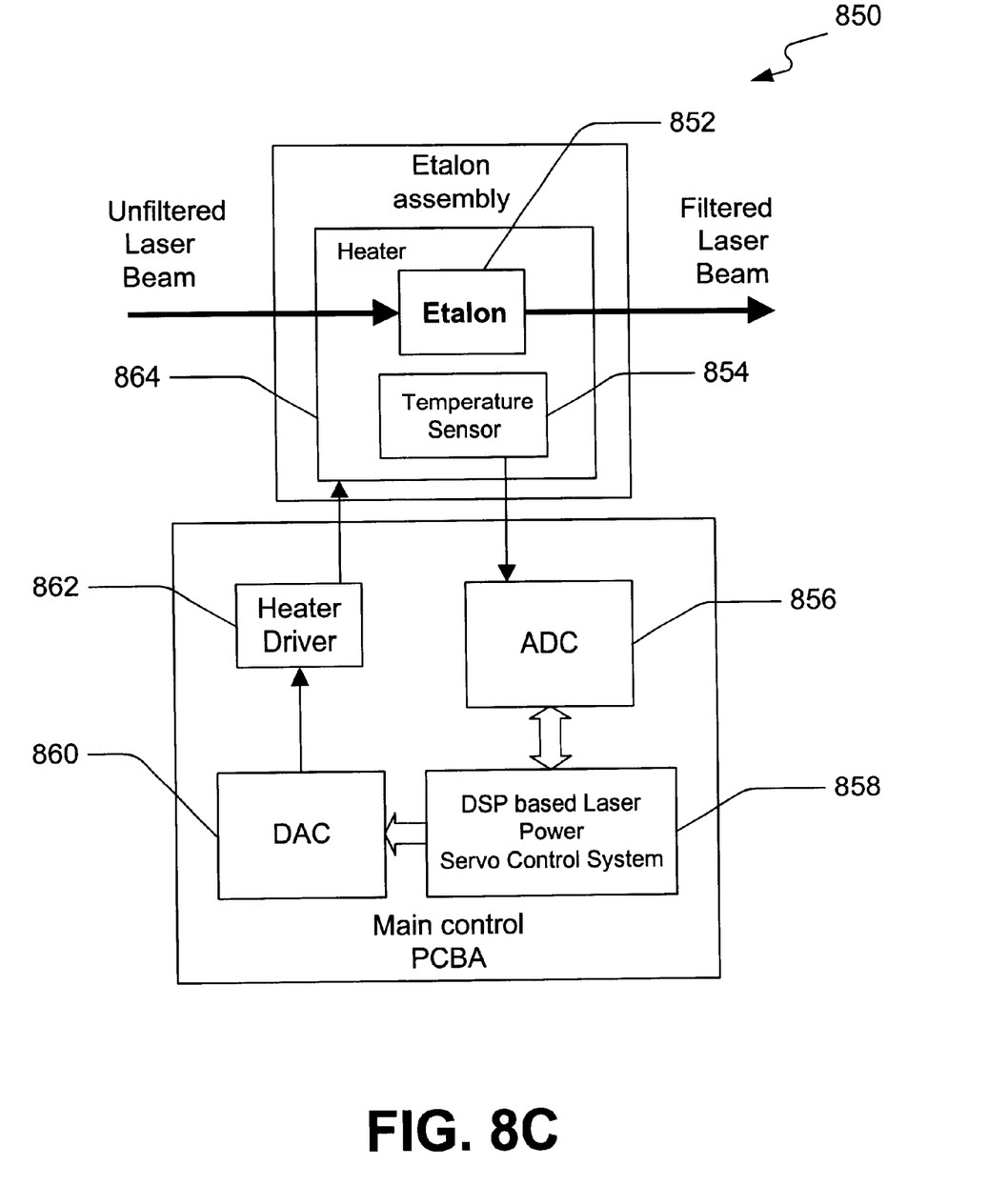
FIG. 8C shows an etalon temperature control servo system that monitors the temperature of the etalon utilizing the signal derived from a thermal sensor.

The etalon temperature control servo system 850, shown in FIG. 8C, monitors the temperature of the etalon 852 utilizing the signal derived from the thermal sensor 854. The thermal sensor 854 is located near the etalon 852. This temperature level signal is sampled by the analog-to-digital converter 856 on command from the system DSP 858, at some appropriate periodic rate. The rate may programmed to be adequate to sustain the etalon temperature at an acceptable level. The system DSP 858 performs the control based on the latest sample. The DSP 858 then commands the desired output value to the digital-to-analog converter 860. The generated voltage is sent to the heater driver 862, which drives the heater 864 with the selected amount of power. The temperature value may be learned during factory calibration, and may be preserved by the DSP 858 by storing the value in a non-volatile memory device in the DSP's memory space.

While specific embodiments of the invention have been illustrated and described, other embodiments and variations are possible. For example, the laser array modules of specific embodiments as described above or other embodiments may be used in a telecommunication equipment or devices such as a line card.

All these are intended to be encompassed by the following claims.

What is claimed is:

1. A laser array system, comprising:
   a plurality of lasers at different laser wavelengths, each laser providing an output light having certain wavelength and power, said output light having at least two parts, first part of said at least two parts used for stabilization of said wavelength and power, said each laser having a thermoelectric cooler for controlling temperature of said each laser;
   a switching mechanism having a plurality of input ports coupled to receive first parts of output light from said plurality of lasers, respectively, and having one output port configured to select one of said first parts to be output at said output port at a time and to switch any one of said first parts to be output at said output port;
   a wavelength locking mechanism optically coupled to receive light from said output port and configured to monitor and measure a drift of said wavelength of said output light of a selected laser from a reference wavelength for said selected laser; and
   a lase parameter feedback control coupled to control drifts in wavelength of said plurality of lasers, one laser at a time, and to receive a signal from said wavelength locking mechanism indicative of said drift of said selected laser, said laser parameter feedback control configured to adjust said selected laser to reduce said drift to lock said wavelength of said selected laser relative to said reference wavelength.

2. The system of claim 1, wherein said each laser is configured to have at least two facets, one of said at least two facets providing said first part.

3. The system of claim 2, wherein said one of said at least two parts provide between 5 to 10% of the laser power for detecting power.

4. The system of claim 1, further comprising:
   a fused fiber tap line configured to receive said collimated beam from said each laser and split said beam into two parts having uneven amounts of power.

5. The system of claim 1, further comprising:
   a prism and a phase grating in an output path of each laser to split output light of said each laser into two parts with spatial offset between said two parts, one of said two parts constituting said first part to be coupled to a respective input port of said switching mechanism.

6. The system of claim 1, wherein said switching mechanism is an optical switch.

7. The system of claim 6, wherein said optical switch includes at least one moving shutter to unblock said first part of output light from a laser to select said laser for correcting said drift in wavelength and block said first part of said laser when another laser is selected.

8. The system of claim 6, wherein said optical switch includes an optical modulator to be in an on-state to transmit said first part of output light from a laser to select said laser for correcting said drift in wavelength and in an off-state to block said first part of said laser when another laser is selected.

9. The system of claim 6, wherein said optical switch includes a glavo mirror rotatable to select and direct one of optical beams received at said input ports to said output port, and a switching lens located between said input ports and said galvo mirror to direct said optical beams from said input ports to said galvo mirror.

10. The system of claim 6, wherein said optical switch includes collimating lenses located to respectively collimate beams received from said input ports and a galvo mirror located between said collimating lenses and said output port to select one optical beam at a time to said output port.

11. The system of claim 1, wherein said wavelength locking mechanism includes an optical etalon which has a free spectral range substantially equal to a frequency spacing between two adjacent laser frequencies produced by two of said plurality of lasers.

12. The system of claim 1, wherein said laser parameter feedback control is a temperature feedback control configured to change the wavelength of said selected laser by adjusting a temperature of a corresponding thermoelectric cooler.

13. The system of claim 1, further comprising:
   a beam splitter an optical path between said output port of said switching mechanism and said wavelength locking mechanism to split a portion of said first part of said output light from said selected laser; and
   an optical detector located to receive said split portion to measure output power of said selected laser, said optical detector,
   wherein said laser parameter feedback control is coupled to receive said measured output power and is operable to correct a power variation of said selected laser from a desired output power.

14. The system of claim 13, wherein said laser parameter feedback control is configured to adjust the power of said selected laser by adjusting a driving current to said selected laser.

15. A line card module providing optical communication, comprising:
- a plurality of lasers, each laser providing an output light having certain wavelength and power, said output light having at least two parts, first part of said at least two parts used for stabilization of said wavelength and power, said each laser having a thermoelectric cooler for controlling temperature of said each laser;
- a switching mechanism configured to receive and sequentially select said first part of said output light from said plurality of lasers;
- a wavelength locking mechanism configured to produce wavelength references relative to which said plurality of lasers are respectively to be locked and to monitor and measure a drift of said wavelength of said output light of a selected laser;
- a laser parameter feedback control configured to adjust said selected laser to lock said wavelength relative to a respective wavelength reference; and
- at least one fiber operating to carry optical information provided by a plurality of output lights.

16. The module as in claim 15, wherein said wavelength locking mechanism includes a single Fabry-Perot cavity which has a free spectral range substantially equal to a frequency spacing between two adjacent laser frequencies produced by two of said plurality of lasers.

17. The module as in claim 16, further including a thermal control mechanism to stabilize a temperature of said Fabry-Perot cavity.

18. A method for locking a plurality of lasers at different laser wavelengths, comprising:
- providing a single optical element which produces wavelength references relative to which the plurality of lasers are respectively to be locked;
- directing a portion of an optical output beam of a first laser of the plurality of lasers into the single optical element to measure a drift in wavelength in the first laser from a respective first wavelength reference;
- according to the measured drift, controlling the first laser to correct the drift and to lock the first laser at the respective first wavelength reference;
- directing a portion of an optical output beam of another laser into the single optical element and switching off the portion of the optical output beam of the first laser from the single optical element; and
- locking a wavelength of the other laser relative to a respective wavelength reference by adjusting the other laser to correct a drift in wavelength.

19. The method as in claim 18, wherein the different laser wavelengths have an equal frequency spacing between two spectrally-adjacent laser wavelengths, and wherein the single optical element is a Fabry-Perot cavity with a free spectral range substantially equal to said frequency spacing.

20. The method as in claim 18, wherein a temperature of the first laser is controlled to correct the drift.

21. The method as in claim 18, further comprising:
- directing another portion of the optical output beam of the first laser into an optical power detector to measure a power of the first laser; and
- controlling the first laser according to the measured power to maintain the power at a desired power value.

22. The method as in claim 21, wherein a driving current to the first laser is adjusted to correct a power variation.

23. A laser system, comprising:
- a plurality of tunable lasers to be operated at different laser wavelengths with an equal frequency spacing;
- a Fabry-Perot cavity with a free spectral range being substantially equal to said equal frequency spacing to produce a plurality of different laser wavelength references;
- an optical switch, optically coupled to said plurality of tunable lasers and said Fabry-Perot cavity, having a plurality of input ports to respectively receive laser output beams from said plurality of tunable lasers and an output port to selectively output one of said received laser output beams to said Fabry-Perot cavity; and
- a control circuit controlling said optical switch to select one laser output beam from a selected tunable laser into said Fabry-Perot cavity and to control said selected tunable laser according to an optical signal produced by said Fabry-Perot cavity to stabilize said selected laser at one of said different laser wavelength references produced by said Fabry-Perot cavity.

24. The system as in claim 23, further comprising:
- a first optical detector located to receive an optical transmission of said Fabry-Perot cavity; and
- a second optical detector located to receive a fraction of optical input to said Fabry-Perot cavity,
- wherein said control circuit is coupled to said first and said second optical detectors to receive detector outputs.

25. The system as in claim 24, wherein said control circuit is further configured to stabilize a power of said selected tunable laser according to an output of said second optical detector.

* * * * *